(12) United States Patent
Shibata et al.

(10) Patent No.: US 9,921,279 B2
(45) Date of Patent: Mar. 20, 2018

(54) MAGNETIC RESONANCE IMAGING DEVICE

(71) Applicant: Hitachi, Ltd., Tokyo (JP)

(72) Inventors: Keiichiro Shibata, Tokyo (JP); Mitsushi Abe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 380 days.

(21) Appl. No.: 14/787,485

(22) PCT Filed: May 13, 2014

(86) PCT No.: PCT/JP2014/062751
§ 371 (c)(1),
(2) Date: Oct. 28, 2015

(87) PCT Pub. No.: WO2014/185429
PCT Pub. Date: Nov. 20, 2014

(65) Prior Publication Data
US 2016/0091579 A1 Mar. 31, 2016

(30) Foreign Application Priority Data
May 16, 2013 (JP) ................... 2013-103744

(51) Int. Cl.
| G01V 3/00 | (2006.01) |
| G01R 33/38 | (2006.01) |
| G01R 33/3873 | (2006.01) |
| G01R 33/42 | (2006.01) |
| G01R 33/3815 | (2006.01) |

(52) U.S. Cl.
CPC ..... *G01R 33/3806* (2013.01); *G01R 33/3873* (2013.01); *G01R 33/42* (2013.01); *G01R 33/3815* (2013.01)

(58) Field of Classification Search
CPC .............. G01R 33/42; G01R 33/3806; G01R 33/3815; G01R 33/3873
See application file for complete search history.

(56) References Cited

U.S. PATENT DOCUMENTS 5,061,897 A * 10/1991 Danby ................. G01R 33/383
324/318
6,335,670 B1 * 1/2002 Kinanen ............ G01R 33/3815
324/319
2008/0100295 A1 5/2008 Nakayama et al.

FOREIGN PATENT DOCUMENTS

| JP | 2001-224571 A | 8/2001 |
| JP | 2003-061931 A | 3/2003 |
| JP | 2006-102060 A | 4/2006 |

OTHER PUBLICATIONS

International Search Report of PCT/JP2014/062751.

* cited by examiner

*Primary Examiner* — Minh N Tang
(74) *Attorney, Agent, or Firm* — Mattingly & Malur, PC (57) ABSTRACT

An open-type magnetic resonance imaging device provides uniformity of a magnetic field without the necessity of lowering the degree of openness, and without increasing the superconducting wire material. The device includes at least one pair of main coils; at least one pair of shield coils; a pair of annular first magnetic substances disposed on an inner radial side of the main coils so that the first magnetic substances are plane symmetrical to each other; and second magnetic substances as protrusion portions disposed on an outer circumferential side of an end surface of the first magnetic substances on an opposite side of the first magnetic substances.

5 Claims, 9 Drawing Sheets

MAGNETIC RESONANCE IMAGING DEVICE

TECHNICAL FIELD

The present invention relates to a magnetic resonance imaging device (MRI), in particular, to an open-type MRI device.

BACKGROUND ART

A medical MRI device uses a phenomenon called nuclear magnetic resonance that occurs when a spherical or an elliptically spherical imaging space in which a static magnetic field is uniformly distributed is irradiated with an electromagnetic wave so as to acquire tomographic images of an examinee. Unless uniformity of the magnetic field in the imaging space is satisfactory in the MRI device, the images may distort or their shades may become irregular. Thus, the magnetic field in the imaging space needs to have uniformity on the order of several ppm. In addition, the magnetic field of the MRI device has been strengthened so as to improve the S/N ratio of images and acquire clear images.

MRI devices are mainly categorized as a tunnel-type and an open-type based on their shapes. The latter type allows the space around the examinee to be wider than the former type. That is, since the latter type has a large degree of openness than the former type, claustrophobia of the examinee can be reduced. In addition, the latter type is superior to the former type in accessibility to the examinee. A typical open-type MRI device has a structure in which a pair of main coils that generates main magnetomotive force and a pair of coil groups or a pair of magnetic substances that adjusts uniformity of the magnetic field are disposed in a pair of vertically divided opposite magnetic poles.

As a related art of the present technical field, JP 2003-061931 A (PTL 1) is known. The abstract of the publication describes that "laminates 24a, 24b of directional silicon steel plates are disposed on opposite surfaces 32 of annular protrusion portions 20a, 20b so that the surfaces of the steel plates become nearly in parallel with the opposite surfaces 32. The course of magnetic fluxes generated by superconducting coils 26a, 26b is changed to the direction represented by an arrow 33 at the laminates 24a, 24b. As a result, the magnetic field strength of an outer circumferential portion (A portion) of a uniform magnetic field region 12 increases." In addition, paragraph [0056] of the publication describes that "according to the present embodiment, a laminate 48b of a lower directional silicon steel plate is disposed and secured on an inner circumferential side of the lower annular protrusion portion 20b."

CITATION LIST

Patent Literature

PTL 1: JP 2003-061931 A

SUMMARY OF INVENTION

Technical Problem

However, in the technique described in PTL 1, since the laminates 24a, 24b are disposed on surfaces on the uniform magnetic field region 12 side of the annular protrusion portions 20a, 20b that are magnetic substances. Thus, since the laminates 24a, 24b are disposed close to the uniform magnetic field region 12, the gantry gap becomes narrow. As a result, the degree of openness of the MRI device decreases.

When the laminate 48b is disposed on an inner circumferential side of the annular protrusion portion 20b, which is a magnetic substance, the radial widths of support members that support the superconducting coils and magnetic substances to which large magnetic force is applied increase, namely the diameters of the coils increase, as the magnetic field strength of the MRI device increase. Thus, the degree of openness of the MRI device decreases. In addition, when the diameters of the coils increase, the numbers of turns of the coils increase to obtain predetermined magnetic field strength. Since the length of the superconducting wire increases, the cost of the MRI device rises.

On the other hand, in a high-field open-type MRI device, magnetic lines of force are concentrated near upper and lower ends in the direction of a center axis of coils in an imaging space. As a result, uniformity of a magnetic field deteriorates. However, the technique described in PTL 1 is a technique that causes the magnetic fluxes to be deflected toward the uniform magnetic field region (imaging space) 12 (refer to paragraph [0034] of PTL 1), not a means for solving the foregoing problem.

The present invention is made in view of the foregoing problem with respect to strengthening the magnetic field of the open-type MRI device. An object of the present invention is to provide an open-type magnetic resonance imaging device that improves uniformity of a magnetic field without necessity of lowering the degree of openness, increasing the superconducting wire material, and thereby raising a device cost.

Solution to Problem

To achieve the above object, the present invention is a magnetic resonance imaging device including: at least one pair of main coils that has a center axis coaxial to each other and that is plane symmetrical to each other with respect to a plane perpendicular to the center axis; at least one pair of shield coils that is disposed on an outer radial side of the main coils and on an opposite plane side so that the shield coils are coaxial to the main coils and are plane symmetrical to each other with respect to the plane, the shield coils generating a magnetic field opposite to that of the main coils; a pair of annular first magnetic substances disposed on an inner radial side of the main coils so that the first magnetic substances are plane symmetrical to each other with respect to the surface; and second magnetic substances as protrusion portions disposed on an outer circumferential side of an end surface on an opposite plane side of the first magnetic substances.

In addition, the present invention is a magnetic resonance imaging device including the main coils, the shield coils, the first magnetic substances, and third magnetic substances that are disposed on an outer circumferential surface of the first magnetic substances and that are made from a material having saturation magnetization greater than that of the first magnetic substances.

In addition, the present invention is a magnetic resonance imaging device including the main coils, the shield coils, the first magnetic substances, and fourth magnetic substances that have an inner diameter greater than that of the first magnetic substances, that have an outer diameter greater than an inner diameter of the main coils and smaller than an outer diameter of the shield coils, and that are disposed on an end surface on an opposite plane side of the first magnetic substances.

Advantageous Effects of Invention

The present invention can provide an open-type magnetic resonance imaging device that improves uniformity of a magnetic field in an imaging space without necessity of lowering the degree of openness, increasing a superconducting wire material, and thereby raising a device cost.

DESCRIPTION OF EMBODIMENTS

Next, embodiments of the present invention will be described with reference to the accompanying drawings as needed.

In the following drawings, identical or equivalent members are represented by the identical reference numerals. The sizes and shapes of members may be changed or exaggerated for clarity of description.

First Embodiment

First, with reference to FIGS. 1 to 5, a magnetic resonance imaging device (MRI device) 1 according to the first embodiment of the present invention will be described.

Figure 1:
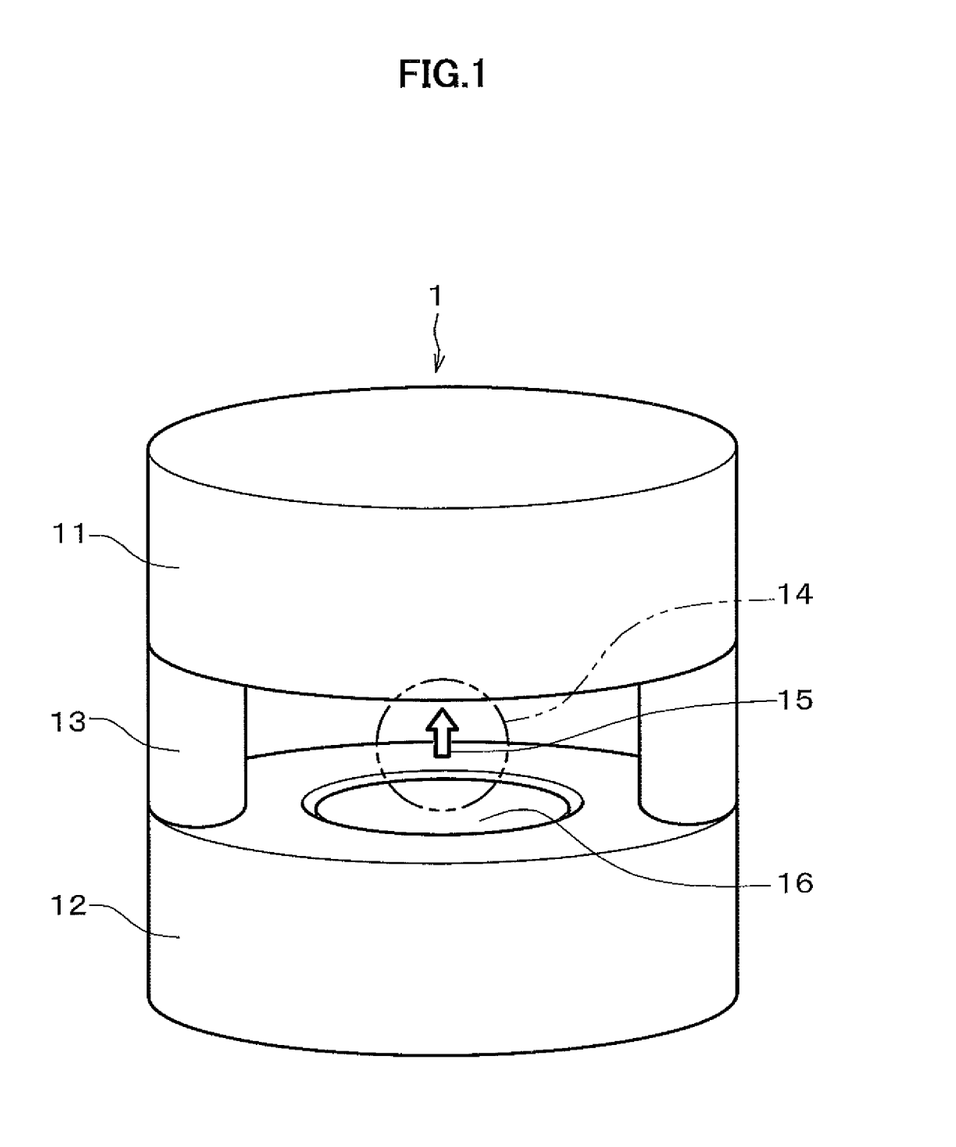
FIG. 1 is an outlined perspective view showing an MRI device according to a first embodiment of the present invention.

FIG. 1 is an outlined perspective view showing the MRI device 1 according to the first embodiment of the present invention.

As shown in FIG. 1, the MRI device 1 is a high-field open-type MRI device. The MRI device 1 includes an upper vacuum vessel 11, a lower vacuum vessel 12, and connection pillars 13. Each of the upper vacuum vessel 11 and the lower vacuum vessel 12 houses a superconducting coil and a magnetic substance. The upper vacuum vessel 11 and the lower vacuum vessel 12 are connected by the connection pillars 13.

Disposed at center of the MRI device 1 is a spherical or elliptically spherical imaging space 14. The MRI device 1 generates a uniform magnetic field 15 having an accuracy on the order of several ppm in the direction of a center axis 2 (refer to FIG. 2) in the imaging space 14. In addition, shim trays 16 are disposed so that they vertically sandwich the imaging space 14. When magnetic pieces are adequately disposed on the shim trays 16, a fine deviation from a target magnetic field can be corrected although it cannot be adjusted by the magnetic substances disposed in the vacuum vessels 11, 12.

Figure 2:
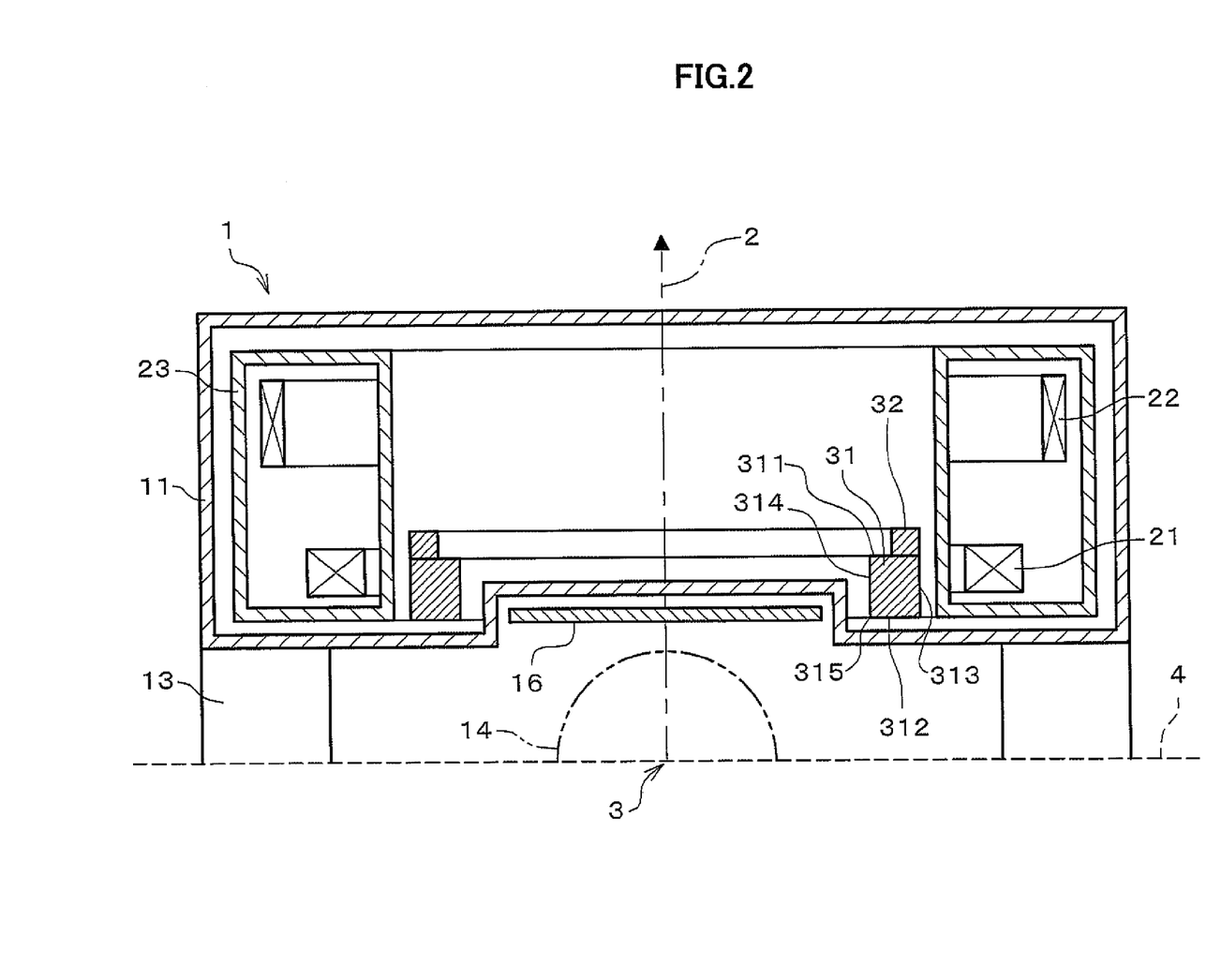
FIG. 2 is an outlined longitudinal sectional view showing the MRI device according to the first embodiment of the present invention.

FIG. 2 is an outlined longitudinal sectional view showing the MRI device 1 according to the first embodiment of the present invention. FIG. 2 shows the structure of an upper half of the MRI device 1. The structure of a lower half of the MRI device 1 is the same as that of the upper half (this illustration rule applies to FIGS. 6 to 9).

As shown in FIG. 2, the MRI device 1 includes at least one pair of superconducting main coils 21 that has a center axis 2 coaxial to each other and that is plane symmetrical to each other with respect to an equatorial plane 4 that passes through a center 3 of the imaging space 14 and that is perpendicular to the center axis 2; and at least one pair of shield coils 22 that are disposed on an outer radial side of the superconducting main coils 21 and on an opposite equatorial plane 4 side so that the shield coils 22 are coaxial to the superconducting main coils 21 and plane symmetrical to each other with respect to the equatorial plane 4. The superconducting main coils 21 generate a magnetic field in a direction opposite to that of the shield coils 22.

The superconducting main coils 21 generate main magnetomotive force. The shield coils 22 decrease a leak of the magnetic field. The superconducting main coils 21 and the shield coils 22 are disposed in refrigerant vessels 23. In addition, the superconducting main coils 21 and the shield coils are covered with vacuum vessels 11, 12 that insulate heat. In FIG. 2, the vacuum vessel 12 is omitted.

The MRI device 1 has one pair of annular first magnetic substances 31 that is used to adjust a magnetic field and that is disposed on an inner radial side of the superconducting main coils 21 and plane symmetrically to each other with respect to the equatorial plane 4. The shim trays 16 are disposed on an inner radial side of the first magnetic substances 31.

According to the first embodiment, the MRI device 1 has second magnetic substances 32 as protrusion portions that are disposed on an outer circumferential side of an end surface 311 on an opposite equatorial plane 4 side of the first magnetic substances 31, namely disposed on a side close to an outer circumferential surface 313. In other words, the second magnetic substances 32 have an inner diameter greater than that of the first magnetic substances 31 and are disposed on the end surface 311 on the opposite equatorial plane 4 side of the first magnetic substances 31. The second magnetic substances 32 have a function that causes a line 6 (refer to FIG. 5) corresponding to an orientation of magnetization that passes through an end point 315 on an inner circumferential surface 314 side of an end surface 312 on the equatorial plane 4 side of the first magnetic substance 31 to be attracted toward the superconducting main coil 21.

The first magnetic substance 31 and the second magnetic substance 32 are made from, for example, iron. The first magnetic substance 31 and the second magnetic substance 32 may be separately manufactured and later combined.

Alternatively, the first magnetic substance 31 and the second magnetic substance 32 may be integrally manufactured as one part.

In FIG. 2, parts that are out of the scope of the present invention such as other magnetic substances that are used to adjust a magnetic field are omitted for clarity of the description (this illustration rule applies to the other accompanying drawings).

Figure 3:
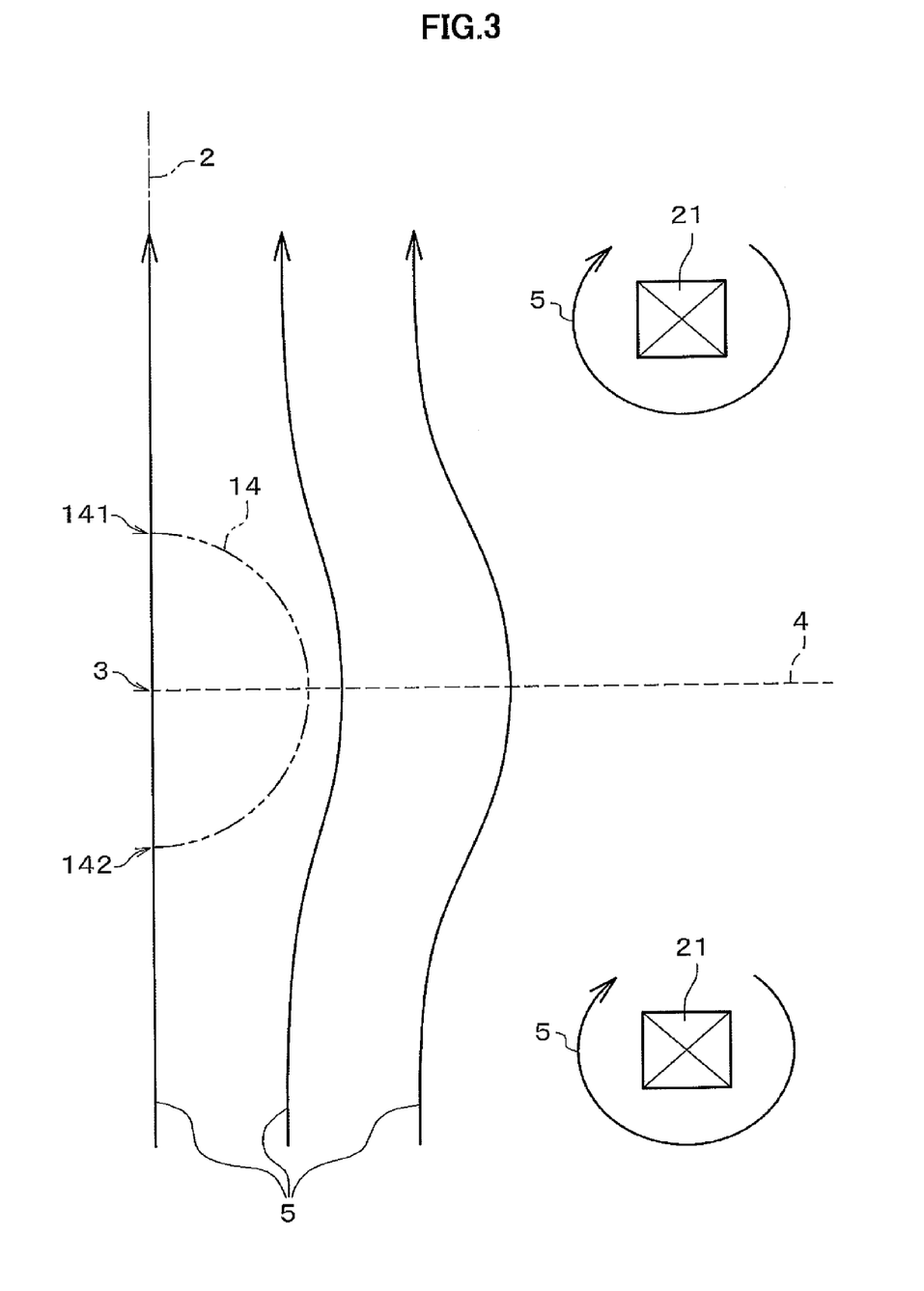
FIG. 3 is a conceptual diagram schematically showing magnetic lines of force generated by a superconducting main coil.
Figure 4:
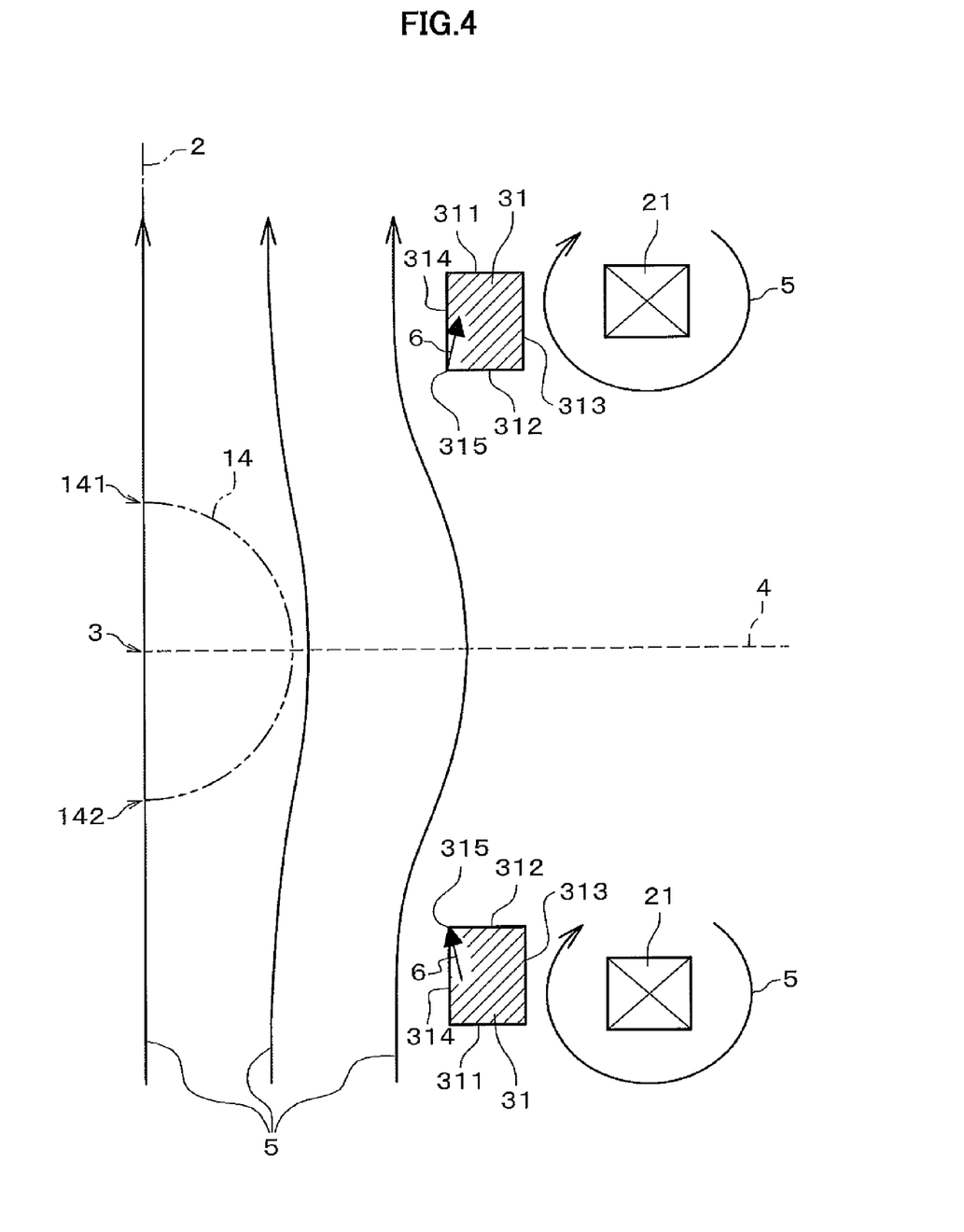
FIG. 4 is a conceptual diagram schematically showing a magnetic field correction effect according to a conventional technique as a comparative example.
Figure 5:
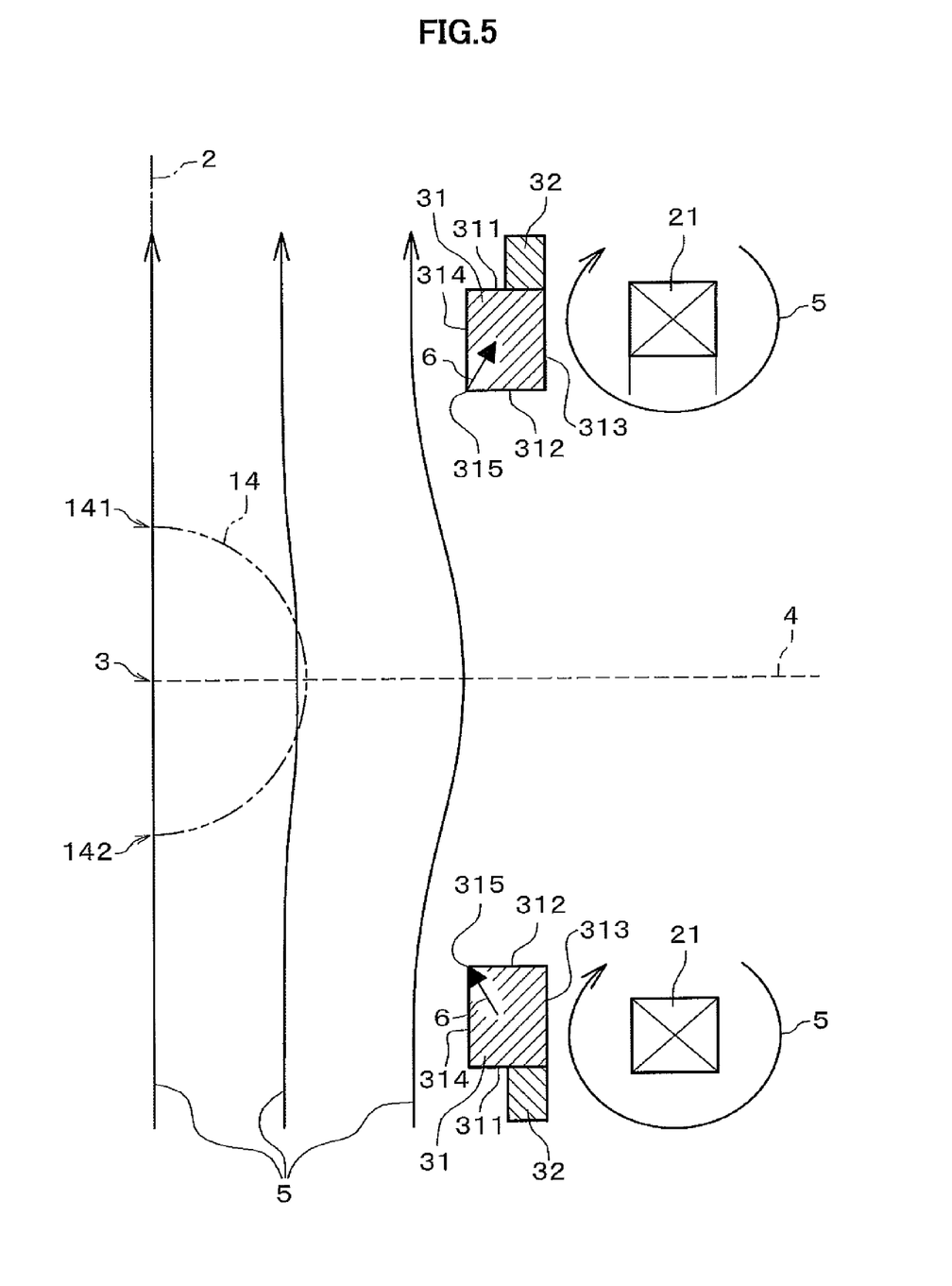
FIG. 5 is a conceptual diagram schematically showing a magnetic field correction effect according to the first embodiment of the present invention.

Next, with reference to FIGS. 3 to 5, an action of the MRI device 1 having the foregoing structure will be described. FIG. 3 is a conceptual diagram schematically showing magnetic lines of force that the superconducting main coils generate. FIG. 4 is a conceptual diagram schematically showing a magnetic field correction effect according to a related art as a comparative example. FIG. 5 is a conceptual diagram schematically showing a magnetic field correction effect according to the first embodiment of the present invention.

As shown in FIG. 3, the superconducting main coil 21 that creates main magnetomotive force generates magnetic lines of force 5. The magnetic lines of force 5 are concentrated near a North magnetic pole 141 that is an upper end of the center axis 2 and a South magnetic pole 142 that is a lower end of the center axis 2 and on an inner radial side, namely on the center axis 2 side in the imaging space 14. Thus, the density of the magnetic lines of force 5 decreases as they are close to the equatorial plane 4. As a result, uniformity of the magnetic field in the imaging space 14 deteriorates.

FIG. 4 schematically shows the magnetic lines of force 5 generated by the first magnetic substances 31 and magnetization that occurs therein. The first magnetic substances 31 uses magnetization that occurs in the direction of the center axis 2 in the first magnetic substances 31 to strengthen the magnetic field in the direction of the center axis 2. In addition, since the line 6 corresponding to the orientation of magnetization that passes through the end point 315 on the inner circumferential surface 314 side of the end surface 312 on the equatorial plane 4 side of the first magnetic substance 31 is attracted toward the superconducting main coil 21, the first magnetic substance 31 is provided to acquire an effect to prevent the magnetic lines of force 5 from being concentrated near the North magnetic pole 141 and the South magnetic pole 142 and on the inner radial side, namely on the center axis 2 side, in the imaging space 14 (magnetic field correction effect).

The magnetic field correction effect of the first magnetic substance 31 is proportional to the radial width of the longitudinal cross section (cross section of the vertical surface) of the first magnetic substance 31 and to the distance in the direction of the center axis 2 from the first magnetic substance 31 to the equatorial plane 4. However, when the radial width of the first magnetic substance 31 increases, the radial widths of support members that support magnetic substances (not shown) such as the superconducting main coils 21 and the first magnetic substance 31 increase, namely the diameters of the coils increase. As a result, the degree of openness of the MRI device 1 decreases. In addition, when the diameters of the coils increase, the required numbers of turns of the coils increase to acquire predetermined magnetic field strength. As a result, since the length of the superconducting wire increases, the cost of the MRI device 1 rises. In contrast, when the first magnetic substance 31 is disposed close to the equatorial plane 4, the gantry gap narrows and thereby the degree of openness of the MRI device 1 decreases.

FIG. 5 schematically shows the magnetic lines of force 5 generated by the second magnetic substances 32 and magnetization that occurs in the first magnetic substances 31 when the second magnetic substances 32 are disposed on the outer circumferential side of the end surfaces 311 on the opposite equatorial plane 4 side of the first magnetic substances 31. As shown in FIG. 5, the second magnetic substances 32 strengthen the action that causes the line 6 corresponding to the orientation of magnetization that passes through the end point 315 on the inner circumferential surface 314 side of the end surface 312 on the equatorial plane 4 side of the first magnetic substance 31 to be attracted toward the superconducting main coil 21. As a result, the foregoing magnetic field correction effect can be improved without necessity of increasing the radial width of the first magnetic substance 31.

As a result, the magnetic lines of force 5 that are concentrated near the North magnetic pole 141 and the South magnetic pole 142 that are upper and lower ends in the direction of the center axis 2 and on the center axis 2 side in the imaging space 14 are attracted toward the superconducting main coils 21. Thus, the uniformity of the magnetic field in the imaging space 14 improves.

The first magnetic substance 31 and the second magnetic substance 32 may be disposed inside or outside the vacuum vessels 11 and 12. In addition, the first magnetic substance 31 and the second magnetic substance 32 may be disposed inside or outside the refrigerant vessel 23.

In addition, since the second magnetic substance 32 according to the first embodiment is disposed in a space on the opposite equatorial plane 4 side of the first magnetic substance 31, the gantry gap does not narrow. As a result, the degree of openness of the MRI device 1 does not decrease. Moreover, since the radial width of the first magnetic substances 31 does not increase, neither the diameter of the coil, nor the length of the superconducting wire increases. As a result, a cost increase of the MRI device 1 can be prevented.

As described above, in the MRI device 1 according to the first embodiment, the second magnetic substance 32 as a protrusion portion is disposed on the outer circumferential side of the end surface 311 on the opposite equatorial plane 4 side of the first magnetic substance 31. The second magnetic substance 32 causes the line 6 (refer to FIG. 5) corresponding to the orientation of magnetization that passes through the end point 315 on the inner circumferential surface 314 of the end surface 312 on the equatorial plane 4 side of the first magnetic substance 31 to be attracted toward the superconducting main coil 21. As a result, the magnetic lines of force 5 that are concentrated near the upper and lower ends (North magnetic pole and South magnetic pole) in the direction of the center axis 2 and on the center axis 2 side in the imaging space 14 are attracted toward the superconducting main coil 21. Consequently, the uniformity of the magnetic field in the imaging space 14 improves.

Thus, the MRI device 1 according to the first embodiment can improve the uniformity of the magnetic field in the imaging space 14 without necessity of decreasing the degree of openness of the MRI device 1 and raising the device cost by increasing the length of the superconducting wire.

If only the first magnetic substance 31 provides predetermined uniformity of the magnetic field, when the radial width of the first magnetic substance 31 is decreased, the degree of openness of the MRI device 1 can be further increased. In addition, since the length of the superconducting wire decreases, the manufacturing cost of the MRI device 1 can be further reduced.

As described above, the MRI device 1 according to the first embodiment has a technical significance of which a magnetic substance that attracts the line 6 (refer to FIG. 5) corresponding to the orientation of magnetization that passes through the end point 315 on the equatorial plane 4 side of the inner circumferential surface 314 of the first magnetic substance 31 toward the superconducting main coil 21 is disposed adjacent to the first magnetic substance 31 without necessity of disposing the magnetic substance closer to the equatorial plane 4 than the first magnetic substance 31 (narrowing the gantry gap) and widening the radial width of the first magnetic substance 31.

Next, other embodiments having the same technical significance as the first embodiment will be described.

Second Embodiment

Next, with reference to FIG. 6, an MRI device 1a according to a second embodiment of the present invention will be described mainly with respect to differences from the first embodiment. The description with reference to similarities to the first embodiment will be omitted.

Figure 6:
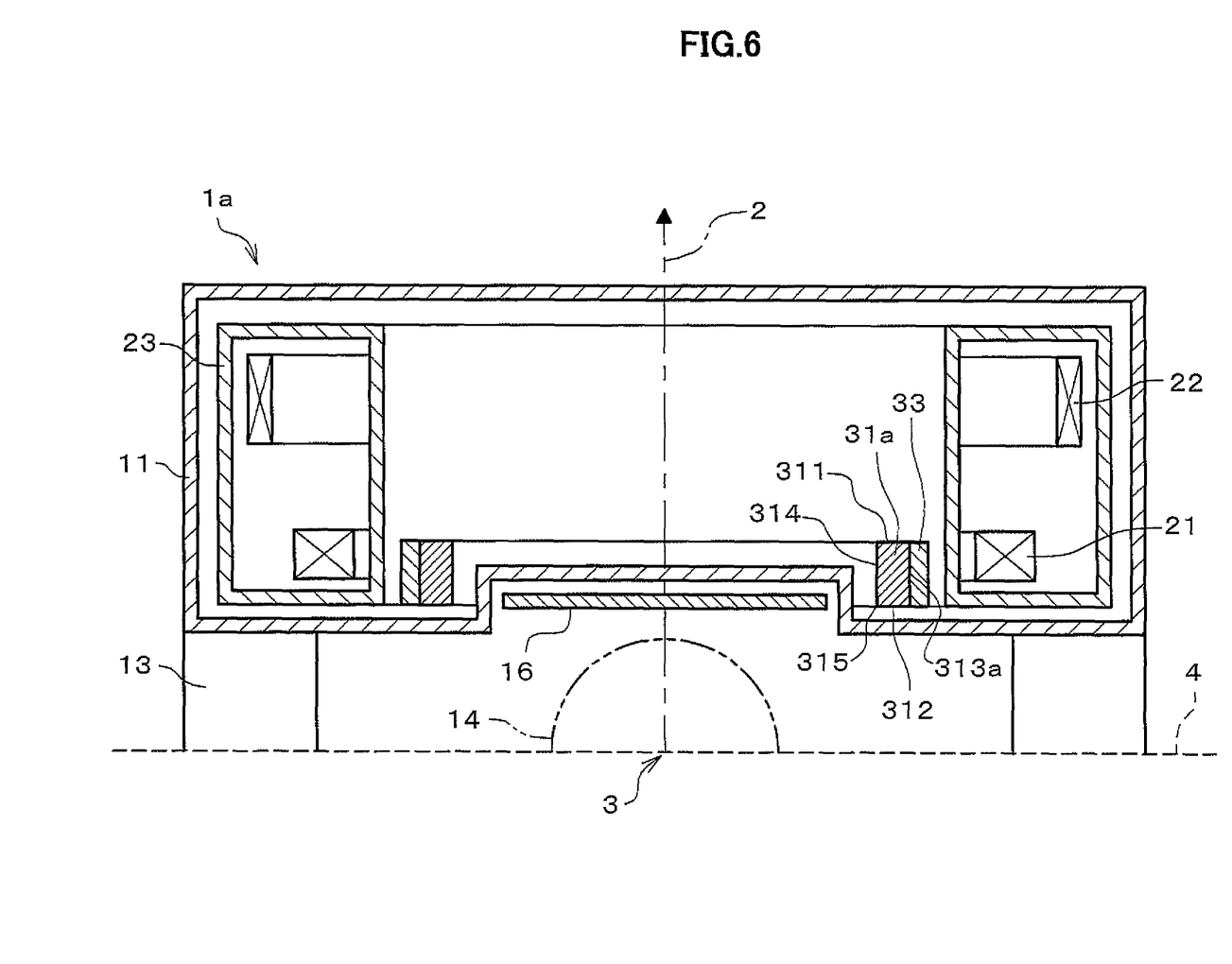
FIG. 6 is an outlined longitudinal sectional view showing an MRI device according to a second embodiment of the present invention.

FIG. 6 is an outlined longitudinal sectional view showing the MRI device 1a according to the second embodiment.

As shown in FIG. 6, a superconducting main coil 21 and a shield coil 22 are disposed in a refrigerant vessel 23. In addition, the superconducting main coil 21 and the shield coil 22 are covered with vacuum vessels 11, 12 that insulate heat. In FIG. 6, the vacuum vessel 12 is omitted. The MRI device 1a also has one pair of annular first magnetic substances 31a that adjust a magnetic field. The first magnetic substances 31a are disposed on an inner radial side of the superconducting main coils 21 so that the first magnetic substances 31a are plane symmetrically to each other with respect to an equatorial plane 4. A shim tray 16 is disposed on an inner radial side of the first magnetic substance 31.

The MRI device 1a according to the second embodiment has a third magnetic substance 33 instead of the second magnetic substance 32 of the MRI device 1 according to the first embodiment. The third magnetic substance 33 is disposed on an outer circumferential surface 313a of the first magnetic substance 31a and is made from a material having saturation magnetization greater than the first magnetic substance 31a.

The material of the third magnetic substance 33 is, for example, a silicon steel plate or permendur having saturation magnetization greater than iron that is commonly used as a material of the first magnetic substance 31a.

According to the second embodiment, the third magnetic substance 33 strengthens an action that causes a line 6 (refer to FIG. 5) corresponding to the orientation of magnetization that passes through an end point 315 on an inner circumferential surface 314 side of an end surface 312 on an equatorial plane 4 side of the first magnetic substance 31a to be attracted toward the superconducting main coil 21. Thus, magnetic lines of force 5 (refer to FIG. 5) that are concentrated near upper and lower ends (North magnetic pole and South magnetic pole) in the direction of a center axis 2 and on a center axis 2 side in an imaging space 14 are attracted toward the superconducting main coil 21. As a result, uniformity of the magnetic field in the imaging space 14 improves.

The magnetic field correction effect that prevents the magnetic lines of force 5 from being concentrated near the upper and lower ends (North magnetic pole and South magnetic pole) and on the center axis 2 side in the imaging space 14 when the third magnetic substance 33 is made from a material having saturation magnetization greater than that of the first magnetic substance 31a according to the second embodiment is greater than when the third magnetic substance 33 is made from the same material as that of the first magnetic substance 31a. Thus, according to the second embodiment, the first magnetic substance 31a has an outer diameter smaller than that of the first magnetic substance 31 according to the first embodiment. In addition, a total radial width of the first magnetic substance 31a and the third magnetic substance 33 is smaller than or equal to the radial width of the first magnetic substance 31 according to the first embodiment. However, according to the second embodiment, the magnetic field correction effect can be sufficiently improved without necessity of increasing the radial width.

The first magnetic substance 31a and the third magnetic substance 33 may be disposed inside or outside the vacuum vessels 11 and 12. In addition, the first magnetic substance 31a and the third magnetic substance 32 may be disposed inside or outside the refrigerant vessel 23.

Thus, the second embodiment can have the same action and effect as the first embodiment. In other words, the MRI device 1a according to the second embodiment can improve the uniformity of the magnetic field in the imaging space 14 without necessity of decreasing the degree of openness of the MRI device 1a, and raising the device cost by increasing the length of the superconducting wire.

Third Embodiment

Next, with reference to FIG. 7, an MRI device 1b according to a third embodiment of the present invention will be described mainly with respect to differences from the second embodiment. The description with reference to similarities to the second embodiment will be omitted.

Figure 7:
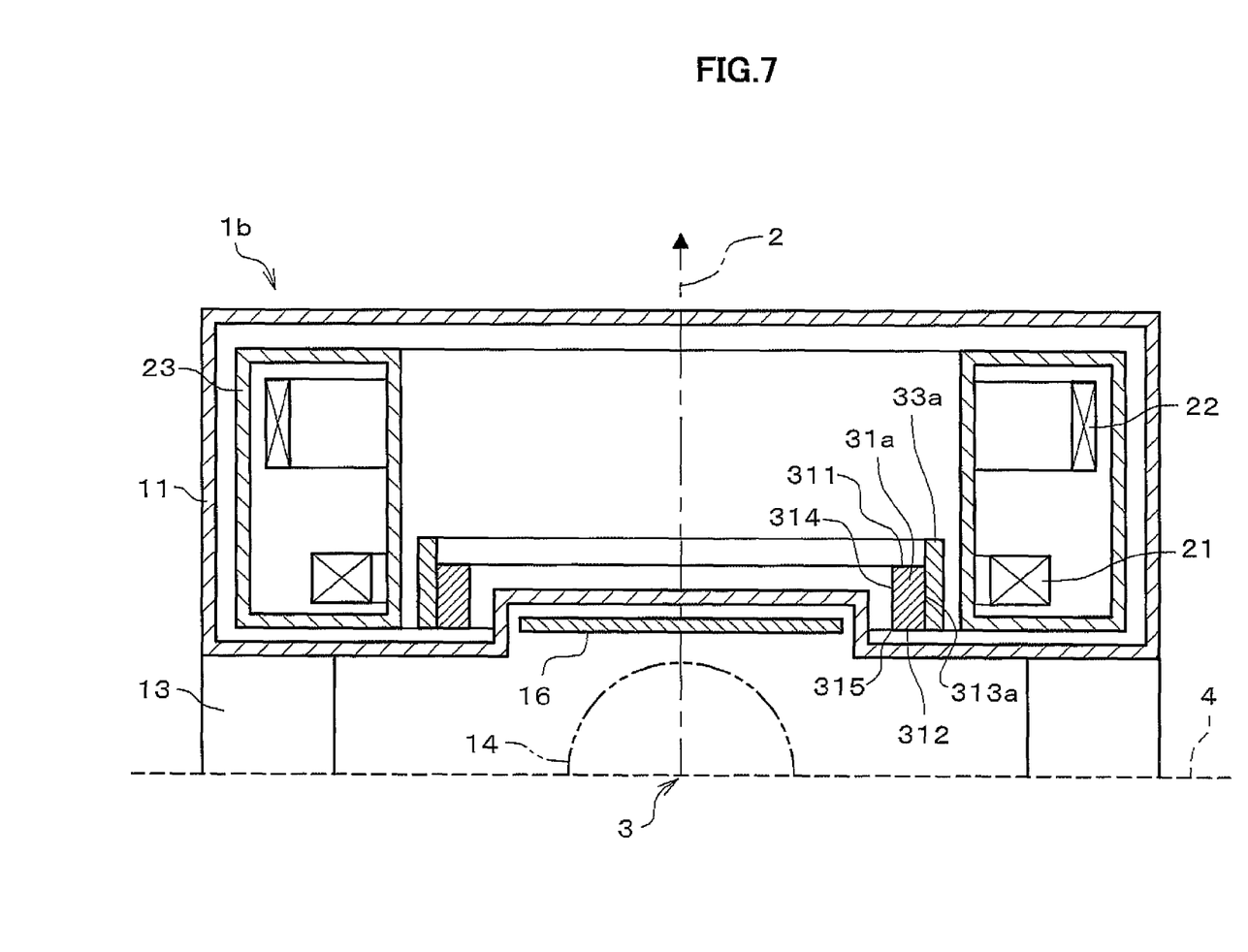
FIG. 7 is an outlined longitudinal sectional view showing an MRI device according to a third embodiment of the present invention.

FIG. 7 is an outlined longitudinal sectional view showing an MRI device 1b according to a third embodiment of the present invention.

As shown in FIG. 7, the MRI device 1b according to the third embodiment is different from the MRI device 1a according to the second embodiment in that an end surface on an opposite equatorial plane 4 side of a third magnetic substance 33a extends to the opposite equatorial plane 4 side so that the end surface on the opposite equatorial plane 4 side of the third magnetic substance 33a is more away from the equatorial plane 4 than an end surface 311 on an opposite equatorial plane 4 side of a first magnetic substance 31a.

The third embodiment can provide the same action and effect as the second embodiment. In addition, the third embodiment can improve the correction effect of uniformity of a magnetic field more without necessity of narrowing a gantry gap.

Fourth Embodiment

Next, with reference to FIG. 8, an MRI device 1c according to a fourth embodiment of the present invention will be described mainly with respect to differences from the first embodiment. The description with reference to similarities to the first embodiment will be omitted.

Figure 8:
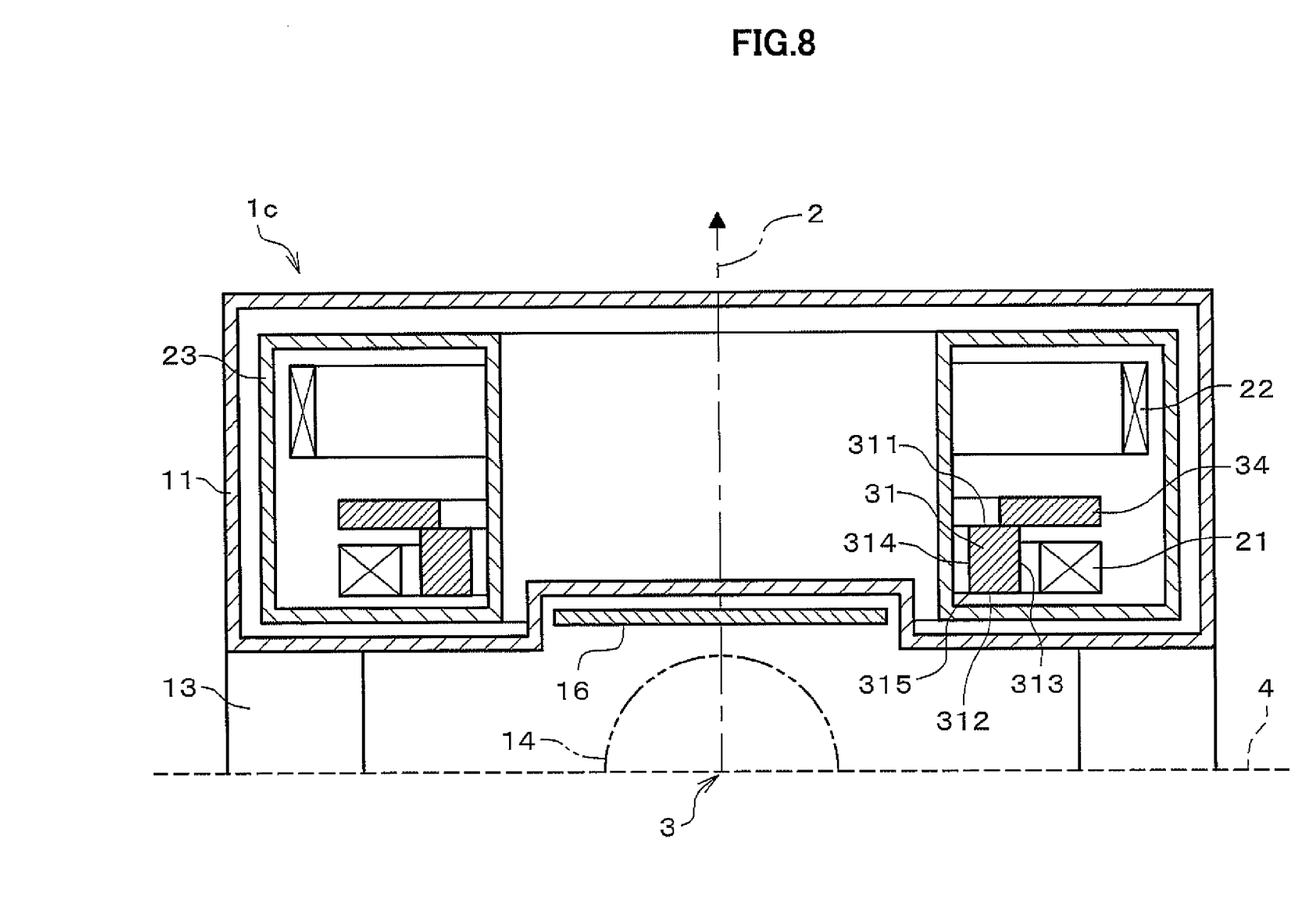
FIG. 8 is an outlined longitudinal sectional view showing an MRI device according to a fourth embodiment of the present invention.

FIG. 8 is an outlined longitudinal sectional view showing the MRI device 1c according to the fourth embodiment of the present invention.

As shown in FIG. 8, a superconducting main coil 21, a shield coil 22, a first magnetic substance 31 that adjusts a magnetic field, and a fourth magnetic substance 34 are disposed in a refrigerant vessel 23. In addition, these members are covered with vacuum vessels 11, 12 that insulate heat. In FIG. 8, the vacuum vessel 12 is omitted. A shim tray 16 is disposed on an inner radial side of the first magnetic substance 31.

The MRI device 1c according to the fourth embodiment has a fourth magnetic substance 34 instead of the second magnetic substance 32 of the MRI device 1 according to the first embodiment. The fourth magnetic substance 34 has an inner diameter greater than that of the first magnetic substance 31 and has an outer diameter greater than an inner diameter of the superconducting main coil 21 and smaller than an outer diameter of the shield coil 22. The fourth magnetic substance 34 is disposed on an end surface 311 on an opposite equatorial plane 4 side of the first magnetic substance 31.

In other words, the first magnetic substance 31 and the second magnetic substance 32 according to the first embodiment are disposed in the refrigerant vessel 23. The second magnetic substance 32 has a large outer diameter so that the second magnetic substance 32 extends to an outer radial side and matches an end surface on the opposite equatorial plane 4 side of the superconducting main coil 21. The first magnetic substance 31 and the fourth magnetic substance 34 may be separately manufactured and later combined. Alternatively, the first magnetic substance 31 and the fourth magnetic substance 34 may be integrally manufactured as one part.

The fourth embodiment can have the same action and effect as the first embodiment. In addition, the fourth embodiment has the following action and effect. In other words, the fourth magnetic substance 34 allows magnetic lines of force that occur around the superconducting main coil 21 to be drawn outside the coil so as to decrease an experience magnetic field of the superconducting main coil 21.

Although the critical temperature depends on magnetic field intensity and current density, if the critical temperature of the superconducting wire of the superconducting main coil 21 exceeds a predetermined value, the superconducting state is lost. This phenomenon is referred to as quenching. When quenching occurs, since coolant such as liquid helium is quantitatively wasted, the running cost of the MRI device rises. Until the MRI device restores to the superconducting state, the MRI device cannot be used. Thus, the operating ratio of the MRI device lowers. According to the fourth embodiment, when the experience magnetic field of the superconducting wire is weakened, the critical temperature can be raised. Thus, the occurrence probability of quenching due to a local temperature rise can be decreased. As a result, the running cost and the operating ratio of the MRI device can be prevented from rising and decreasing, respectively.

Fifth Embodiment

Next, with reference to FIG. 9, an MRI device 1d according to a fifth embodiment of the present invention will be described mainly with respect to differences from the second embodiment. The description with reference to similarities to the second embodiment will be omitted.

Figure 9:
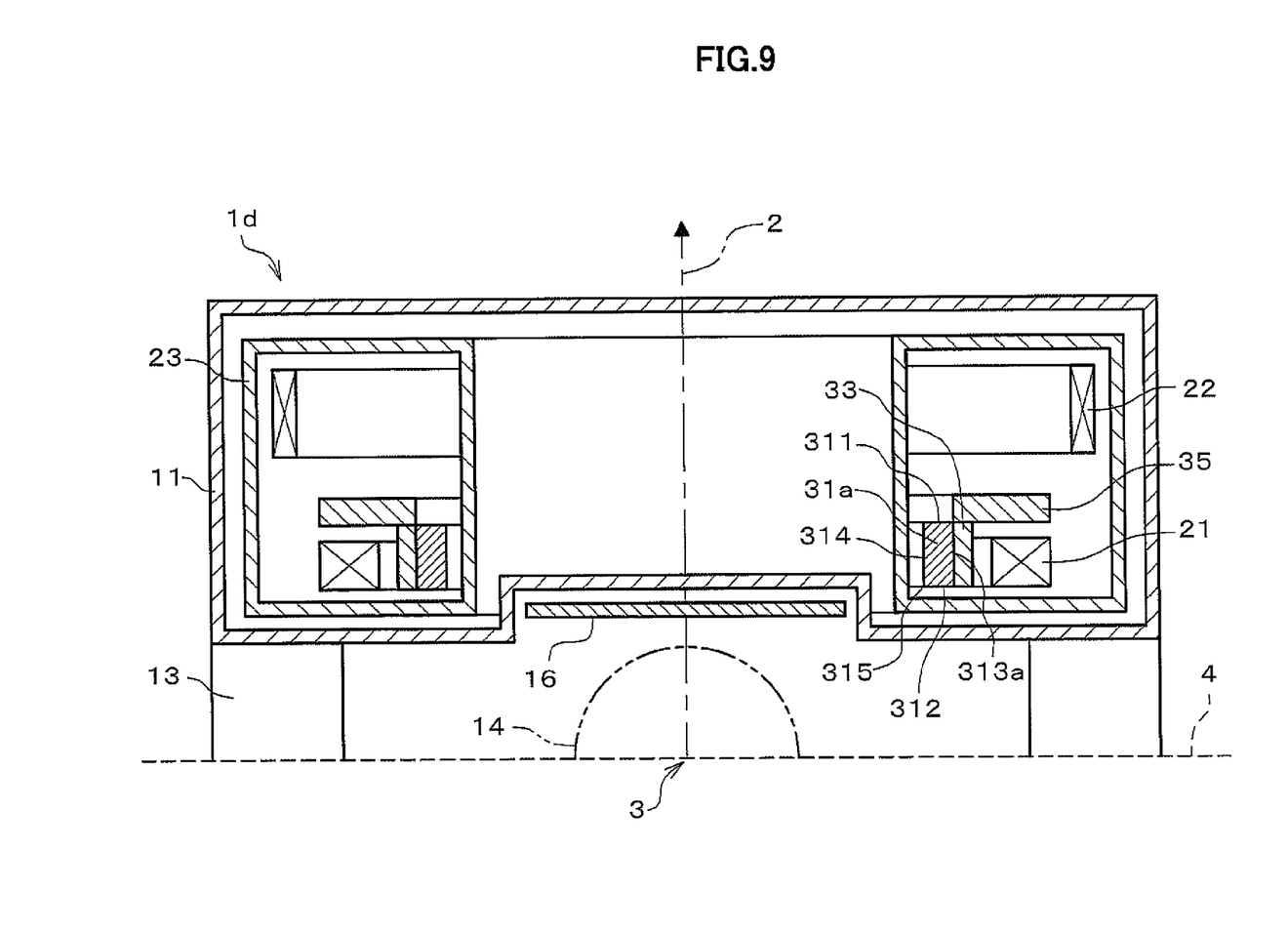
FIG. 9 is an outlined longitudinal sectional view showing an MRI device according to a fifth embodiment of the present invention.

FIG. 9 is an outlined longitudinal sectional view showing the MRI device 1d according to the fifth embodiment.

As shown in FIG. 9, a superconducting main coil 21, a shield coil 22, a first magnetic substance 31a that adjusts a magnetic field, a third magnetic substance 33 made from a material having saturation magnetization greater than the first magnetic substance 31a, and a fifth magnetic substance 35 are disposed in a refrigerant vessel 23. In addition, these members are covered with vacuum vessels 11, 12 that insulate heat. In FIG. 9, the vacuum vessel 12 is omitted. A shim tray 16 is disposed on an inner radial side of the first magnetic substance 31a.

The MRI device 1d according to the fifth embodiment has the first magnetic substance 31a and the third magnetic substance 33 according to the second embodiment and the fifth magnetic substance 35. The first magnetic substance 31a and the third magnetic substance 33 are disposed in the refrigerant vessel 23. In addition, the fifth magnetic substance 35 has an inner diameter greater than that of the first magnetic substance 31a and has an outer diameter greater than an inner diameter of the superconducting main coil 21 and smaller than an outer diameter of the shield coil 22. The fifth magnetic substance 35 is disposed on an end surface on an opposite equatorial plane 4 side of the first magnetic substance 31a and is made from a material having saturation magnetization greater than that of the first magnetic substance 31a. The fifth magnetic substance 35 is disposed on the opposite equatorial plane 4 side of the first magnetic substance 31a. The fifth magnetic substance 35 extends on the outer radial side so that the fifth magnetic substance 35 matches the end surface on the opposite equatorial plane 4 side of the superconducting main coil 21.

The material of the fifth magnetic substance 35 is for example a silicon steel plate or permendur having saturation magnetization greater than iron that is commonly used as a material of the first magnetic substance 31a. The material of the fifth magnetic substance 35 may be the same as or different from that of the third magnetic substance 33. The third magnetic substance 33 and the fifth magnetic substance 35 may be separately manufactured and later combined. Alternatively, the third magnetic substance 33 and the fifth magnetic substance 35 may be integrally manufactured as one part.

The fifth embodiment can have the magnetic field correction effect greater than that of the second embodiment. In addition, the fifth embodiment allows more magnetic lines of force that occur around the superconducting main coil 21 to be drawn outside the coil so as to decrease an experience magnetic field of the superconducting main coil 21 than the fourth embodiment.

The present invention is not limited to the foregoing embodiments. The present invention may include various modifications of these embodiments. The foregoing embodiments describe the present invention in details so that it can be easily understood. The embodiments of the present invention are not necessary limited to those that have all the structures that have been described. In addition, a part of the structure of one embodiment may be substituted with the structure of another embodiment. Alternatively, the structure of one embodiment may be added to the structure of another embodiment. A part of the structure of each embodiment may be added to, subtracted from, and/or substituted with the structure of another embodiment.

For example, according to the fifth embodiment, the fifth magnetic substance 35 is disposed on the end surface on the opposite equatorial plane 4 side of the third magnetic substance 33. Alternatively, the fifth magnetic substance 35 may be disposed on the opposite equatorial plane 4 side of the outer circumferential surface of the third magnetic substance. In this case, it is preferred that the end surface on the opposite equatorial plane 4 side of the third magnetic substance 33 is disposed on the opposite equatorial plane 4 side of the equatorial plane 4 so that the end surface matches the third magnetic substance 33a according to the third embodiment. Thereafter, it is preferred that the fifth magnetic substance 35 is disposed on the outer circumferential surface of the third magnetic substance 33*a*.

| Reference Signs List | |
|---|---|
| 1, 1a to 1d | MRI device (magnetic resonance imaging device) |
| 2 | center axis |
| 4 | equatorial plane (flat plane) |
| 14 | imaging space |
| 21 | superconducting main coil |
| 22 | shield coil |
| 31, 31a | first magnetic substance |
| 32 | second magnetic substance |
| 33, 33a | third magnetic substance |
| 34 | fourth magnetic substance |
| 35 | fifth magnetic substance |
| 311 | end surface |
| 313a | outer circumferential surface |

The invention claimed is:

1. A magnetic resonance imaging device comprising:
at least one pair of main coils that has a center axis coaxial to each other and that is plane symmetrical to each other with respect to a plane perpendicular to the center axis;
at least one pair of shield coils that is disposed on an outer radial side of the main coils and on an opposite plane side so that the shield coils are coaxial to the main coils and are plane symmetrical to each other with respect to the plane, the shield coils generating a magnetic field opposite to that of the main coils;
a pair of annular first magnetic substances disposed on an inner radial side of the main coils so that the first magnetic substances are plane symmetrical to each other with respect to the plane; and
second magnetic substances as protrusion portions disposed on an outer circumferential side of an end surface of the first magnetic substances on an opposite side to the plane.

2. A magnetic resonance imaging device comprising:
at least one pair of main coils that has a center axis coaxial to each other and that is plane symmetrical to each other with respect to a plane perpendicular to the center axis;
at least one pair of shield coils that is disposed on an outer radial side of the main coils and on an opposite plane side so that the shield coils are coaxial to the main coils and are plane symmetrical to each other with respect to the plane, the shield coils generating a magnetic field opposite to that of the main coils;
a pair of annular first magnetic substances disposed on an inner radial side of the main coils so that the first magnetic substances are plane symmetrical to each other with respect to the plane; and
third magnetic substances disposed on an outer circumferential surface of the first magnetic substances and are made from a material having saturation magnetization greater than that of the first magnetic substances.

3. The magnetic resonance imaging device according to claim 2,
wherein an end surface of the third magnetic substances on an opposite side to the plane extends to the opposite direction away from the plane so that the end surface of the third magnetic substances on the opposite side to the plane is more away from the plane than the end surface of the first magnetic substances on the opposite side to the plane.

4. The magnetic resonance imaging device according to claim 2, further comprising:
fifth magnetic substances that have an inner diameter greater than that of the first magnetic substances, that has an outer diameter greater than an inner diameter of the main coils and smaller than an outer diameter of the shield coils, that are disposed on an end surface on the opposite plane side of the third magnetic substances or disposed on the opposite plane side of an outer circumferential surface of the third magnetic substances, and that are made from a material having saturation magnetization greater than that of the first magnetic substances.

5. A magnetic resonance imaging device comprising:
at least one pair of main coils that has a center axis coaxial to each other and that is plane symmetrical to each other with respect to a plane perpendicular to the center axis;
at least one pair of shield coils that is disposed on an outer radial side of the main coils and on an opposite plane side so that the shield coils are coaxial to the main coils and are plane symmetrical to each other with respect to the plane, the shield coils generating a magnetic field opposite to that of the main coils;
a pair of annular first magnetic substances disposed on an inner radial side of the main coils so that the first magnetic substances are plane symmetrical to each other with respect to the plane; and
fourth magnetic substances that have an inner diameter greater than that of the first magnetic substances, that have an outer diameter greater than an inner diameter of the main coils and smaller than an outer diameter of the shield coils, and that are disposed on an end surface on the opposite plane side of the first magnetic substances.

* * * * *